United States Patent
Unrau et al.

(10) Patent No.: US 11,935,811 B2
(45) Date of Patent: Mar. 19, 2024

(54) BASEPLATE FOR A SEMICONDUCTOR MODULE AND METHOD FOR PRODUCING A BASEPLATE

(71) Applicant: Infineon Technologies AG, Neubiberg (DE)

(72) Inventors: Arthur Unrau, Geseke (DE); Elmar Kuehle, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 17/403,298

(22) Filed: Aug. 16, 2021

(65) Prior Publication Data

US 2022/0051964 A1 Feb. 17, 2022

(30) Foreign Application Priority Data

Aug. 17, 2020 (EP) .................................. 20191358

(51) Int. Cl.
*H01L 23/373* (2006.01)
*H01L 23/532* (2006.01)
*H01L 29/16* (2006.01)

(52) U.S. Cl.
CPC .... *H01L 23/3735* (2013.01); *H01L 23/53223* (2013.01); *H01L 29/1608* (2013.01)

(58) Field of Classification Search
CPC ........... H01L 23/3735; H01L 23/53223; H01L 29/1608; H01L 23/15; H01L 24/29; H01L 24/32; H01L 24/48; H01L 24/73; H01L 2224/291; H01L 2224/29139; H01L 2224/32225; H01L 2224/48227; H01L 2224/48472; H01L 2224/8384; H01L 2924/3511; H01L 23/13; H01L 2224/73265; H01L 2224/83851; H01L 21/4871; H01L 23/495–49596; H01L 23/49861; H01L 21/4821–4842; H01L 33/62; H01L 23/49503–49513; H01L 2224/40237; H01L 2224/40257; H01L 2224/48237; H01L 2224/48257

See application file for complete search history.

(56) References Cited

U.S. PATENT DOCUMENTS

| 6,306,684 B1* | 10/2001 | Richardson ....... H01L 23/49513 257/676 |
| 2003/0201525 A1* | 10/2003 | James ................. H01L 23/4334 257/E23.092 |
| 2016/0322274 A1* | 11/2016 | Takizawa ................ H01L 23/12 |

FOREIGN PATENT DOCUMENTS

| DE | 102008054932 A1 | 7/2010 |
| DE | 102014115202 A1 | 4/2016 |
| DE | 102015114522 A1 | 3/2017 |
| EP | 1796164 A1 | 6/2007 |

* cited by examiner

*Primary Examiner* — Cuong B Nguyen
(74) *Attorney, Agent, or Firm* — Murphy, Bilak & Homiller, PLLC

(57) ABSTRACT

A baseplate for a semiconductor module comprises at least one elevation. The at least one elevation is formed integrally with the baseplate. The baseplate has a uniform first thickness or a thickness which decreases continuously from the edge regions toward the center and which is increased locally up to a maximum second thickness in the region of each of the at least one elevation.

11 Claims, 2 Drawing Sheets

BASEPLATE FOR A SEMICONDUCTOR MODULE AND METHOD FOR PRODUCING A BASEPLATE

TECHNICAL FIELD

The present invention relates to a baseplate for a semiconductor module and to a method for producing such a baseplate.

BACKGROUND

Power semiconductor modules usually comprise one or more semiconductor substrates arranged on a baseplate. A semiconductor arrangement comprising a multiplicity of controllable semiconductor components (e.g. IGBTs), is arranged on at least one of the substrates. A semiconductor substrate generally comprises an electrically insulating substrate layer (e.g., a ceramic layer), a first electrically conductive layer (e.g., a metal layer) arranged on a first side of the substrate layer, and a second electrically conductive layer (e.g., a metal layer) arranged on a second side of the substrate layer opposite the first side. The controllable semiconductor components are arranged on the first electrically conductive layer, for example. The second electrically conductive layer is usually connected to the baseplate, that is to say that it is arranged between the baseplate and the insulating substrate layer.

A solder layer is usually arranged between the semiconductor substrate, in particular the second electrically conductive layer, and the baseplate. Said solder layer is firstly configured to mechanically connect the semiconductor substrate to the baseplate. Secondly, heat generated during the operation of the semiconductor arrangement is also dissipated via the solder layer.

In order to guarantee firstly a stable mechanical connection between the semiconductor substrate and the baseplate, and secondly an optimum heat dissipation, it is possible to ensure that the solder layer does not fall below a minimum thickness and does not exceed a maximum thickness. Furthermore, it is possible to ensure that the solder layer has a uniform thickness over the entire area of the baseplate.

Therefore, there is a need for a baseplate and a method for producing a baseplate with which a distance between the baseplate and a semiconductor substrate arranged thereon and thus the thickness of a solder layer situated therebetween can be set in a targeted manner.

SUMMARY

A baseplate for a semiconductor module comprises at least one elevation. The at least one elevation is formed integrally with the baseplate. The baseplate has a uniform first thickness or a thickness which decreases continuously from the edge regions toward the center and which is increased locally up to a maximum second thickness in the region of each of the at least one elevation.

A method comprises producing a baseplate with a uniform first thickness or a thickness which decreases continuously from the edge regions toward the center, and locally increasing the first thickness up to a maximum second thickness in the region of at least one elevation, wherein the at least one elevation is formed integrally with the baseplate.

An arrangement comprises at least one substrate, a connection layer; and a baseplate, wherein the at least one substrate is arranged on the baseplate, and the connection layer is arranged between the at least one substrate and the baseplate and connects them to one another.

The invention is explained in greater detail below on the basis of examples and with reference to the figures. In this case, identical reference signs designate identical elements. The illustration in the figures is not to scale.

BRIEF DESCRIPTION OF THE DRAWINGS

FIG. 2, which comprises

DETAILED DESCRIPTION

In the following detailed description, concrete examples are used as a basis for elucidating how the invention can be realized. It goes without saying that, unless mentioned to the contrary, the features of the various examples described herein can be combined with one another. In so far as specific elements are referred to as "first element", "second element" . . . or the like, the indication "first", "second" . . . serves merely to distinguish different elements from one another. This indication is not associated with an order or enumeration. That means that for example a "second element" can be present even if there is no "first element" present.

Figure 1:
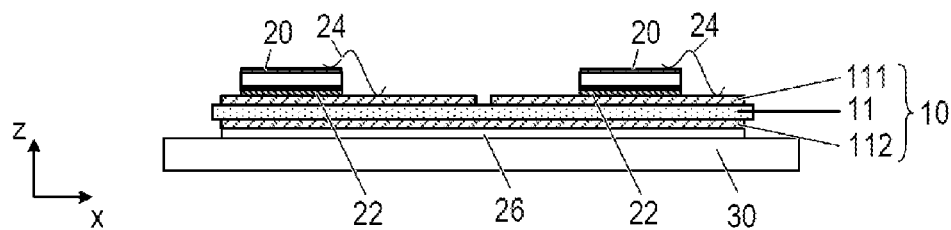
FIG. 1 schematically shows a cross section through a baseplate with a substrate arranged thereon.

Referring to FIG. 1, a semiconductor substrate 10 is illustrated. The semiconductor substrate 10 comprises for example a dielectric isolation layer 11, a (structured) first electrically conductive layer 111 and a (structured) second electrically conductive layer 112. The first electrically conductive layer 111 is arranged on a first side of the dielectric isolation layer 11 and the second electrically conductive layer 112 is arranged on a second side of the dielectric isolation layer 11 opposite the first side. The dielectric isolation layer 11 is thus arranged between the first electrically conductive layer 111 and the second electrically conductive layer 112. In this case, however, the second electrically conductive layer is merely optional. It is likewise possible to arrange only the first electrically conductive layer 111 on the dielectric isolation layer 11 and to completely omit the second electrically conductive layer 112.

Each of the first electrically conductive layer 111 and the second electrically conductive layer 112 can consist of one of the following materials or comprise one of the following materials: copper, a copper alloy, aluminum; an aluminum alloy; any other metal or any other metal alloy which remains in a solid state during the operation of the power semiconductor module. The semiconductor substrate 10 can be a ceramic substrate, that is to say a substrate in which the dielectric isolation layer 11 consists of ceramic. The dielectric isolation layer 11 can thus be a thin ceramic layer, for example. The ceramic of the dielectric isolation layer 11 can for example consist of one of the following materials or comprise one of the following materials: aluminum oxide; aluminum nitride; zirconium oxide; silicon nitride; boron nitride; or any other ceramic. By way of example, the dielectric isolation layer 11 can consist of one of the following materials or comprise one of the following materials: $Al_2O_3$, AlN, or $Si_3N_4$. The semiconductor substrate 10 can be for example a so-called direct copper bonding (DCB) substrate, a direct aluminum bonding (DAB) substrate, an insulated metal substrate (IMS) or an active metal brazing (AMB) substrate. The semiconductor substrate 10 can for example also be a conventional printed circuit board (PCB) with a non-ceramic dielectric isolation layer 11. A non-ceramic dielectric isolation layer 11 can for example consist of a cured resin or comprise a cured resin.

Referring further to FIG. 1, one or more semiconductor bodies 20 can be arranged on the semiconductor substrate 10. Each of the semiconductor bodies 20 on the semiconductor substrate 10 can comprise a diode, an IGBT (insulated gate bipolar transistor), a MOSFET (metal oxide semiconductor field effect transistor), a JFET (junction field effect transistor), an HEMT (high electron mobility transistor), or any other suitable controllable semiconductor component. The one or more semiconductor bodies 20 can form a semiconductor arrangement on the semiconductor substrate 10. Only two semiconductor bodies 20 are illustrated by way of example in FIG. 1.

The first electrically conductive layer 111 illustrated in FIG. 1 is a structured layer. In this context, "structured layer" means that the first electrically conductive layer 111 is not a continuous layer, but rather has interruptions between different sections of the layer. Different semiconductor bodies 20 can be arranged on the same section or on different sections of the first electrically conductive layer 111. The different sections of the first electrically conductive layer 111 can either have no electrical connection among one another or can be electrically connected to one another, e.g. by means of bond wires. Each of the semiconductor bodies 20 can be electrically and mechanically connected to the semiconductor substrate 10 by means of an electrically conductive connection layer 22. FIG. 1 shows by way of example a semiconductor substrate 10 with connection layers 22 arranged thereon. Such an electrically conductive connection layer 22 can be, in principle, a solder layer, a layer composed of an electrically conductive adhesive or a layer composed of a sintered metal powder, e.g. a sintered silver powder.

In principle, however, the first electrically conductive layer 111 can also be a continuous layer. The second electrically conductive layer 112 (if present) can be either a continuous layer or likewise a structured layer.

In order to connect the semiconductor bodies 20 to the semiconductor substrate 10, the semiconductor bodies 20 are arranged on the surface (upper surface) of the semiconductor substrate 10, wherein the connection layer 22 is arranged between the semiconductor substrate 10 and the semiconductor body 20. The upper surface of the semiconductor substrate 10 is a surface of the first electrically conductive layer 11 which faces away from the dielectric isolation layer 11. The semiconductor bodies 20 can alternatively or additionally be connected to the semiconductor substrate 10 for example also by means of bond wires 24.

The semiconductor substrate 10 with the at least one semiconductor body 20 arranged thereon can for example be part of a power semiconductor module and be arranged in a package (not illustrated).

The semiconductor substrate 10 is arranged on a baseplate 30. The baseplate 30 can be a metallic baseplate, for example. While a single semiconductor substrate 10 is arranged on the baseplate 30 in FIG. 1, it is also possible, in principle, to arrange more than one semiconductor substrate 10 on the same baseplate 30. A connection layer 26 is arranged between the semiconductor substrate 10 and the baseplate 30. The connection layer 26 mechanically connects the semiconductor substrate 10 and the baseplate 30 to one another. It is likewise possible for the connection layer 26 to produce an electrical connection between the semiconductor substrate 10 and the baseplate 30. The connection layer 26 can be for example a solder layer, a layer composed of an electrically conductive adhesive or a layer composed of a sintered metal powder, e.g., a sintered silver powder.

The baseplate 30 can be arranged for example on a heat sink (not illustrated). Heat is generally generated during the operation of the semiconductor arrangement. The heat can be dissipated to a heat sink via the semiconductor substrate 10, the connection layer 26 and the baseplate 30. Therefore, the connection layer 26 and the baseplate 30 generally have a good thermal conductivity.

In order to ensure firstly a stable mechanical connection between the semiconductor substrate 10 and the baseplate 30 and secondly a good thermal conductivity, the connection layer 26 generally has a thickness which does not fall below a specific minimum thickness and does not exceed a specific maximum thickness.

Figure 2A:
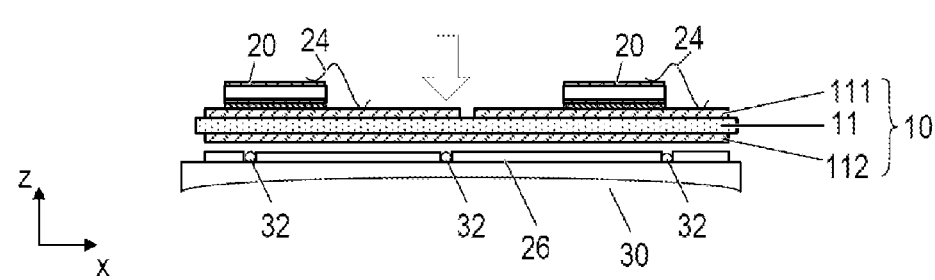
FIGS. 2A and 2B, shows by way of example a cross section through a precurved baseplate with a substrate to be arranged thereon.
Figure 2B:
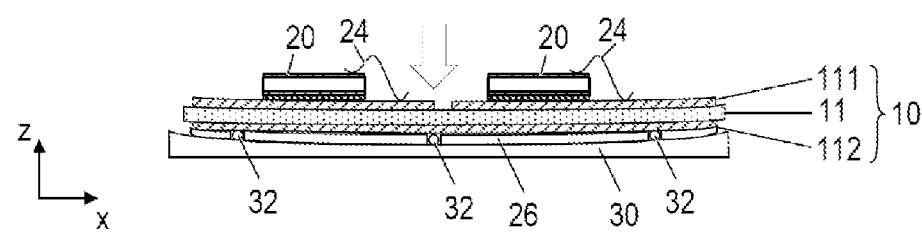

Baseplates 30 can have a specific pre-curvature, for example. However, it is also possible that, before being connected to the semiconductor substrate 10, a baseplate 30 has a substantially planar first surface and a curved second surface opposite the first surface (often also referred to as D-shape). This is illustrated by way of example in FIG. 2. As illustrated in FIG. 2A, initially, i.e., before being connected to the baseplate 30, the semiconductor substrate 10 can have a flat first surface and a curved second surface. During connection to the baseplate 30 (pressing of the substrate 10 onto the baseplate 30), however, the semiconductor substrate 10 and the previously planar first surface of the baseplate 30 can curve on account of the usually different coefficients of expansion (cf. FIG. 2B). At the same time, the originally curved second surface of the baseplate 30 can result in a subsequently substantially planar second surface by virtue of the curvature produced in the baseplate 30 (in particular the first surface) (cf. FIG. 2B). In order to be able to set a curvature of the semiconductor substrate 10 and a thickness of the connection layer 26 in a targeted manner when connecting the semiconductor substrate 10 to the baseplate 30, provision is often made of spacers 32 arranged between the baseplate 30 and the semiconductor substrate 10. Said spacers 32 have, in a direction perpendicular to the upper (first) surface of the baseplate 30, a thickness corresponding to the desired thickness of the connection layer 26. In this case, the upper surface of the baseplate 30 is the surface on which the semiconductor substrate 10 is arranged.

The semiconductor substrate 10 can then be pressed onto each of the spacers 32. The interspace between the baseplate 30 and the semiconductor substrate 10 can be completely filled by the connection layer 26. The thickness of the connection layer 26 can thus be set in a simple manner. The spacers 32 illustrated in FIG. 2 are for example soldered on the baseplate 30 or connected to the baseplate 30 in some other way (e.g. by means of so-called wire bonding).

Figure 3:
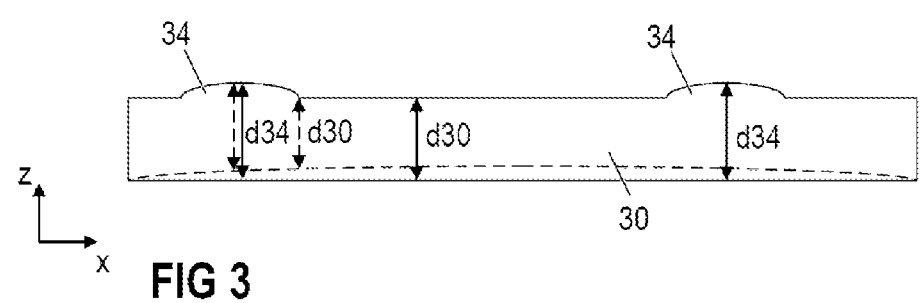
FIG. 3 schematically shows a cross section through a baseplate in accordance with one example.

In order to simplify the entire method for producing a semiconductor module, in accordance with the example illustrated in FIG. 3, provision is made for integrating the spacers directly into the baseplate 30. Conventional baseplates 30 either have the same thickness throughout, or they have a thickness which decreases continuously from the edge regions towards the center, as illustrated by way of example FIG. 2A (so-called D-shape). In this case, the thickness is measured in a direction perpendicular to the upper surface of the baseplate 30, the upper surface of the baseplate 30 being that surface on which the semiconductor substrate 10 is arranged. The baseplate 30 illustrated in FIG. 3 has substantially a uniform thickness d30. However, the baseplate 30 comprises at least one elevation 34. The thickness d34 of the baseplate 30 is increased locally in the region of the at least one elevation 34. The elevations 34 of the baseplate 30 from FIG. 3 have the same task as the spacers 32 illustrated in FIG. 2. That is to say that a semiconductor substrate 10 is arranged on the baseplate 30 in such a way that it bears on the elevations 34. The regions between the elevations 34 and between the baseplate 30 and the semiconductor substrate 26 are filled with the connection layer 26 (semiconductor substrate 10 and connection layer 26 are not explicitly illustrated in FIG. 3). A baseplate 30 with integrated elevations 34 can also have a curved lower surface, however, as illustrated schematically by a dashed line in FIG. 3, in a manner similar to the baseplate 30 illustrated in FIG. 2. The thickness d30 of the baseplate is not uniform in this case, but rather decreases from the edge regions towards the center of the baseplate 30. The thickness d34 of the baseplate 30 is likewise increased locally in the region of the at least one elevation 34.

The elevations 34 in the example illustrated in FIG. 3 are thus formed integrally with the baseplate 30. That is to say that the elevations 34 are concomitantly produced directly during the production of the baseplate 30 and are not subsequently applied (e.g. soldered or applied by means of wire bonding) as additional elements on the baseplate 30. The baseplate 30 can comprise for example a metallic material, e.g. copper (Cu) or aluminum (Al). In the case of such baseplates 30 consisting of a single material throughout, elevations 34 can easily be produced by applying more material in the required regions during the production of the baseplate 30.

Figure 4:
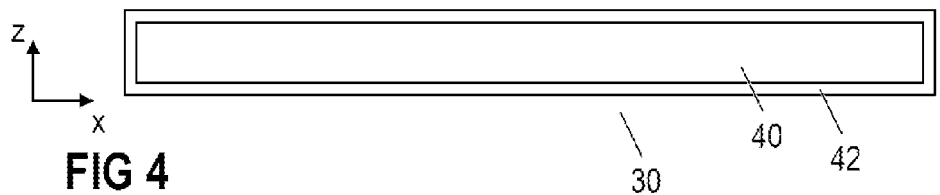
FIG. 4 schematically shows a cross section through a conventional baseplate.

Nowadays, however, very often use is also made of baseplates 30 that consist of a plurality of different materials, e.g. aluminum silicon carbide baseplates (AlSiC baseplates). Such a baseplate 30 is illustrated by way of example in FIG. 4. In this case, the baseplate 30 comprises a first layer 40 composed of a first material, and a second layer 42 comprising both the first material and a second material. In this case, the first layer 40 forms a core completely surrounded by the second layer 42 on all sides. The first layer 40 comprises SiC (silicon carbide), for example. The first layer 40 can be a porous layer. A second material, e.g. aluminum (Al), can then be introduced into the surface of said porous layer by means of infiltration. The second layer 42 can therefore comprise both SiC and Al. In accordance with one example, the second material is introduced into the surface of the porous layer under pressure.

Figure 5:
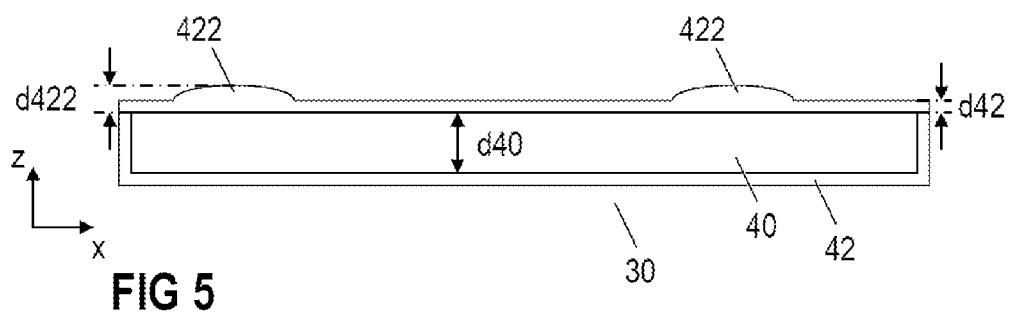
FIG. 5 schematically shows a cross section through a baseplate in accordance with a further example.

In the case of such baseplates 30, the at least one elevation 34 can be produced in various ways. As illustrated in FIG. 5, the first layer 40 can have for example the same thickness d40 throughout (or a thickness which decreases from the edge regions towards the center, cf. FIG. 2A). The second layer 42 can have substantially a second thickness d42. The thickness d422 of the second layer 42 can be increased locally, however, in the region of the elevations 34. That is to say that more of the second material can be applied in the region of the elevations 34 than in the remaining regions of the second layer 42.

Figure 6:
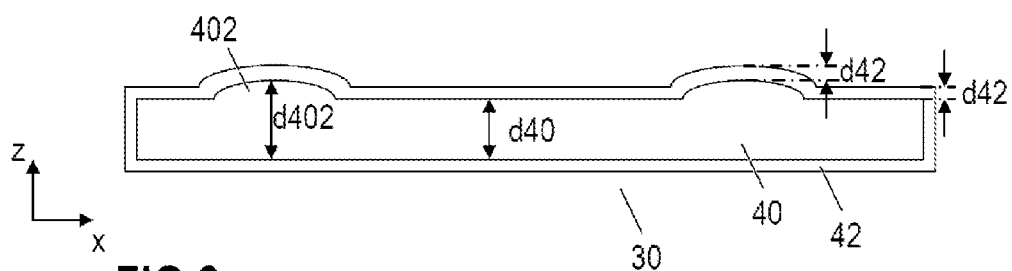
FIG. 6 schematically shows a cross section through a baseplate in accordance with a further example.

This is just one example, however. In accordance with a further example, the first layer 40 can have substantially the first thickness d40 (or a thickness which decreases from the edge regions towards the center). The thickness d402 of the first layer 40 can be increased locally, however, in the region of the elevations 34. That is to say that the thickness d402 of the first layer 40 does not decrease continuously toward the center of the layer, but rather has regions in which the thickness d402 momentarily increases locally. The second layer 42 can be embodied in such a way that it has a substantially uniform thickness d42 throughout. This is illustrated by way of example in FIG. 6.

The elevations 34 can have a rounded shape. Firstly, elevations 34 with a rounded shape are easily able to be produced; secondly, damage to a semiconductor substrate 10 applied on the baseplate 30 as a result of corners or edges can be avoided as a result.

The elevations 34 can have a thickness of between 100 µm (micrometers) and 500 µm, or between 150 µm and 300 µm, at their highest point. The thickness of the elevations 34 results from the difference between the maximum thickness d34 of the baseplate 30 in the region of the elevation 34 and the first thickness d30 of the baseplate 30 in the regions of the baseplate 30 directly next to the elevations 34 (thickness of the elevation 34=d34−d30), cf. FIG. 3.

As already explained above, the thickness of the connection layer 26 can be set by way of the thickness of the elevations 34. After the baseplate 30 and the semiconductor substrate 10 have been connected, the thickness of the connection layer 26 corresponds to the thickness of the elevations 34. A sufficient mechanical connection between baseplate 30 and semiconductor substrate 10 can often be ensured by a minimum thickness of 100 µm or 150 µm, for example. Depending on the various parameters of the baseplate 30, the connection layer 26 and the semiconductor substrate 10 (e.g. material, size, etc.), however, a sufficiently stable mechanical connection may possibly already be produced even with smaller thicknesses, or larger thicknesses may be necessary. By virtue of a maximum thickness not being exceeded, a sufficient thermal connection between semiconductor substrate 10 and baseplate 30 can also be ensured at the same time. The maximum thickness can be 300 µm or 500 µm, for example; depending on parameters of the baseplate 30, the connection layer 26 and the semiconductor substrate 10 (e.g. material, size, etc.), however, this value can also be chosen to be larger or smaller.

Figure 7:
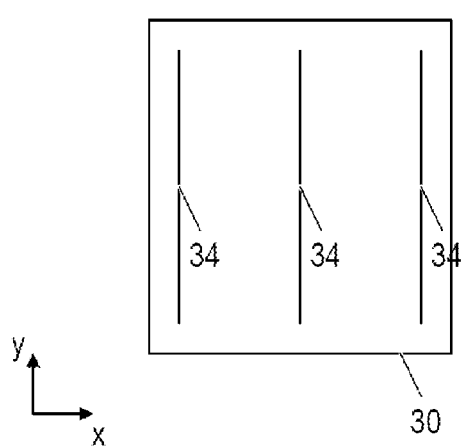
FIG. 7 schematically shows a plan view of a baseplate with integrated elevations in accordance with one example.
Figure 8:
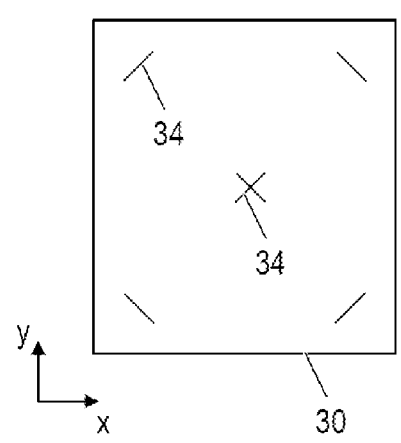
FIG. 8 schematically shows a plan view of a baseplate with integrated elevations in accordance with a further example.

As illustrated in the plan views in FIGS. 7 and 8, the baseplate 30 can have a rectangular or square basic area. In order to ensure a uniform thickness of the connection layer 26, the baseplate 30 can comprise at least two elevations 34, for example. In the example illustrated in FIG. 7, the elevations 34 have an elongated shape. That is to say that a dimension of the elevation 34 in a first horizontal direction x is significantly smaller than a dimension of the elevation in a second horizontal direction y. By way of example, such an elevation 34 can extend in the second horizontal direction y over at least 50%, at least 75% or at least 90% of the entire length of the baseplate 30 in the same direction. In this case, the length of the elevation 34 can be dependent on the size of the semiconductor substrate 10 to be arranged on the baseplate 30. If more than one semiconductor substrate 10 is arranged on a baseplate 30, the size, shape and arrangement of the elevations 34 can deviate accordingly. By way of example, separate elevations 34 can be provided for each semiconductor substrate 10. As will be explained in greater detail below with reference to FIG. 8, the elevations 34 can also be significantly smaller or shorter, and be arranged on the baseplate 30 in any suitable manner.

In principle, the provision of the two outermost elevations 34 illustrated in FIG. 7 can already be sufficient to ensure a uniform thickness of the connection layer 26. However, a further third elevation 34 centrally between the two outer elevations 34 can prevent a central region of the semiconductor substrate 10 from being pressed too closely against the baseplate 30, for example. In this case, the number of elevations 34 can be dependent on a wide variety of factors, such as, for example, the size, the material and the thickness of the semiconductor substrate 10.

In accordance with another example, illustrated schematically in FIG. 8, the baseplate 30 can comprise at least four elevations 34, for example, wherein an elevation 34 is arranged in the region of each of the corners of the baseplate 30. The elevations 34 can have an elongate shape (see FIG. 8) or else be embodied in punctiform fashion (not illustrated). In this example, too, it is possible, if necessary, to provide at least one further elevation 34 arranged for example in a central region of the baseplate 30. In the example in FIG. 8, the central elevation 34 is embodied in the shape of a cross. This is just one example, however. Any other suitable shapes of the elevations 34 are possible, in principle. The number and the arrangement of the elevations 34 illustrated in FIGS. 7 and 8 are also merely by way of example. The elevations 34 can thus be larger or smaller than the elevations 34 illustrated in FIGS. 7 and 8. Moreover, elevations can have in principle any desired shape suitable for setting a distance between semiconductor substrate 10 and baseplate 30.

The elevations illustrated in FIGS. 7 and 8 represent examples of such cases in which only a single semiconductor substrate 10 is arranged on the baseplate 30. If more than one semiconductor substrate 10 is arranged on a single baseplate 30, the number, shape and arrangement of the elevations 34 can vary accordingly. By way of example, for each individual one of the semiconductor substrates 10 elevations 34 could be provided which are arranged in each case in the region of the corners of the semiconductor substrates 10. The size, shape and position of the elevations 34 on the baseplate 30 is unimportant, in principle, for the present invention.

The invention claimed is:

1. A baseplate for a semiconductor module comprising:
at least one elevation, wherein the at least one elevation is formed integrally with the baseplate;
a uniform first thickness or a thickness which decreases continuously from edge regions toward the center and which is increased locally up to a maximum second thickness in a region of each of the at least one elevation;
a first layer comprising a first material; and
a second layer comprising the first material and a second material, wherein the second layer completely surrounds the first layer from all sides.

2. The baseplate as claimed in claim 1, wherein
the first layer has either substantially a uniform third thickness or a thickness which decreases continuously from the edge regions of the first layer toward the center of the first layer;
the thickness of the first layer is increased locally up to a maximum fourth thickness in the region of the at least one elevation; and
the second layer has a fifth thickness.

3. The baseplate as claimed in claim 1, wherein
the first layer has a third thickness or a thickness which decreases continuously from the edge regions towards the center;
the second layer has substantially a fourth thickness; and
the thickness of the second layer is increased locally up to a maximum fifth thickness in the region of the at least one elevation.

4. The baseplate as claimed in claim 1, wherein
the first material comprises silicon carbide; and
the second material comprises aluminum.

5. The baseplate as claimed in claim 1, wherein the at least one elevation has a maximum thickness of between 100 μm and 500 μm, or between 150 μm and 300 μm, at its highest point, wherein the maximum thickness of the elevation results from the difference between the maximum second thickness and the first thickness of the baseplate directly next to the corresponding elevation.

6. The baseplate as claimed in claim 1, wherein the baseplate comprises a rectangular or square basic area and at least two elevations.

7. The baseplate as claimed in claim 6, wherein an elevation is arranged in the region of each of four corners of the baseplate.

8. The baseplate as claimed in claim 7, wherein each of the elevations has an elongate shape or is embodied in punctiform fashion.

9. The baseplate as claimed in claim 6, wherein each of the at least two elevations has a dimension in a first horizontal direction which is significantly smaller than a dimension of the same elevation in a second horizontal direction, perpendicular to the first horizontal direction.

10. A method comprising:
producing a baseplate with a uniform first thickness or a thickness which decreases continuously from edge regions toward the center;
locally increasing the first thickness up to a maximum second thickness in a region of at least one elevation, wherein the at least one elevation is formed integrally with the baseplate;
producing a first layer comprising a first material, wherein the first layer has a uniform third thickness or a thickness which decreases continuously from the edge regions towards the center and which is increased in each case up to a maximum fourth thickness in the region of the at least one elevation; and
producing a second layer comprising the first material and a second material, wherein
the first layer forms a core completely surrounded by the second layer on all sides, and
the second layer has a fifth thickness throughout.

11. An arrangement comprising:
at least one substrate;
a connection layer; and
a baseplate as claimed in any of claim 1, wherein
the at least one substrate is arranged on the baseplate, and
the connection layer is arranged between the at least one substrate and the baseplate and connects them to one another.

* * * * *

UNITED STATES PATENT AND TRADEMARK OFFICE
CERTIFICATE OF CORRECTION

PATENT NO. : 11,935,811 B2
APPLICATION NO. : 17/403298
DATED : March 19, 2024
INVENTOR(S) : A. Unrau et al.

It is certified that error appears in the above-identified patent and that said Letters Patent is hereby corrected as shown below:

In the Claims

Column 8, Line 61 (Claim 11) change "in any one of claim" to -- of claim --

Signed and Sealed this
Thirtieth Day of April, 2024

Katherine Kelly Vidal
*Director of the United States Patent and Trademark Office*